United States Patent [19]

Koepke

[11] Patent Number: 5,015,207

[45] Date of Patent: May 14, 1991

[54] MULTI-PATH FEED-THRU LEAD AND METHOD FOR FORMATION THEREOF

[75] Inventor: Richard A. Koepke, New Bedford, Mass.

[73] Assignee: Isotronics, Inc., New Bedford, Mass.

[21] Appl. No.: 458,092

[22] Filed: Dec. 28, 1989

[51] Int. Cl.$^5$ ............................................... H01R 4/58
[52] U.S. Cl. ..................................... 439/886; 439/78; 439/931; 439/933; 29/847; 29/885
[58] Field of Search ............... 439/884, 886, 907, 931, 439/75, 78, 933; 29/874, 885, 847

[56] References Cited

U.S. PATENT DOCUMENTS

| | | | |
|---|---|---|---|
| 3,148,356 | 9/1964 | Hedden, Jr. ........................... | 439/75 |
| 4,176,901 | 12/1979 | Ishimaru ................................ | 339/136 |
| 4,320,438 | 3/1982 | Ibrahim et al. ....................... | 361/401 |
| 4,406,062 | 9/1983 | Navarro ................................. | 29/847 |
| 4,412,093 | 10/1983 | Wildeboer ............................. | 174/52 |
| 4,506,108 | 3/1985 | Kersch et al. ......................... | 174/52 |
| 4,594,473 | 6/1986 | Inoue et al. ........................... | 174/68 |
| 4,633,573 | 1/1987 | Scherer ................................. | 29/589 |
| 4,649,229 | 3/1987 | Scherer et al. ........................ | 174/52 |
| 4,654,472 | 3/1987 | Goldfarb .............................. | 439/83 |
| 4,716,082 | 12/1987 | Ahearn et al. ............. | 174/152 G M |
| 4,720,915 | 1/1988 | Kennedy et al. ..................... | 29/847 |
| 4,750,031 | 6/1988 | Miller et al. ........................... | 357/81 |
| 4,751,199 | 6/1988 | Phy ........................................ | 437/209 |
| 4,761,518 | 8/1988 | Butt et al. .............................. | 174/52 |
| 4,788,382 | 11/1988 | Ahearn et al. ..................... | 174/50.61 |
| 4,821,151 | 4/1989 | Pryor et al. ........................... | 361/403 |
| 4,830,620 | 5/1989 | Marks et al. .......................... | 439/45 |
| 4,835,120 | 5/1989 | Mallik et al. .......................... | 437/209 |
| 4,841,101 | 6/1989 | Pollock ................................. | 174/152 |

OTHER PUBLICATIONS

IBM Technical Disclosure Bulletin, "Multiple I/O Pin Terminations for Packaging", vol. 20, No. 9, Feb. 1978, p. 3403.

Primary Examiner—Gary F. Paumen
Attorney, Agent, or Firm—Weingarten, Schurgin, Gagnebin & Hayes

[57] ABSTRACT

A multi-path feed-thru lead is disclosed that provides increased conductive pathway density and that has particular utility in combination with microcircuit packages housing hybrid and semiconductor discrete and integrated circuit chips. The multi-path feed-thru leads have a configuration that facilitates sealing thereof in the apertures of microcircuit packages to provide increased conductive path density. The multi-path feed-thru lead according to the present invention includes an insulative substrate having a predetermined geometric configuration and includes an extended intermediate portion and first and second end portions configured to define a plurality of bonding pads that facilitate wire bonding to the circuitry housed in the package and to external circuitry, respectively. A plurality of discrete metalized conductive pathways are formed on the intermediate portion ad first and second end portions of the insulative substrate. In one preferred method of forming the multi-path feed-thru lead of the present invention, the external surface of the insulative substrate is first metalized and then selected portions of metalization are removed to form the plurality of discrete conductive pathways. The multi-path feed-thru lead of the present invention thereby provides multiple conductive pathways on a single substrate member.

17 Claims, 3 Drawing Sheets

MULTI-PATH FEED-THRU LEAD AND METHOD FOR FORMATION THEREOF

FIELD OF THE INVENTION

This invention relates generally to electronic packaging leads, and more particularly to a multi-path feed-thru lead providing a plurality of discrete conductive pathways on a single substrate member.

BACKGROUND OF THE INVENTION

Microcircuit packages such as plug-in packages and flat packs have been used for many years to hermetically protect hybrid and semiconductor discrete and integrated circuit chips. The chip or chips are bottom-mounted within a metal frame, i.e., eyelet or body, of the package and electrically connected to external circuitry by means of conductive leads or pins passing through apertures in the bottom or frame. To ensure hermetic sealing and to preclude short circuiting between the leads and the metal package, the leads are sealed in insulative preforms and the insulative preform-lead combinations are sealed in the apertures of the bottom or frame.

Thus, each lead of prior art packages provided only a single conductive pathway between the integrated circuit chip mounted within the package and external circuitry. In general, the sizing of the package is dictated by the size of the ICs mounted therein. As the chip size decreases, the size of the package is decreased accordingly. Smaller package sizes, however, are generally limited as to the number of apertures that may be formed through the frame thereof, and concomitantly, the number of leads associated therewith. Forming more apertures in the frame of the metal package tends to weaken the overall structural integrity thereof since the spacing between apertures is decreased. For hermetically sealed metal packages and/or metal packages disposed in overpressurized or vacuumized environments, any decrease in the structural integrity of the metal package may lead to decreased package reliability in the operating environment.

The trend in the electronic industry is towards the utilization of very large scale integrated (VLSI) and microwave/millimeter-wave monolithic integrated circuit (MMIC) technology since such technology provides increased operational performance with smaller sized ICs. These technologies, however, require increased conductive pathway densities to accommodate increased data handling capabilities.

For many applications, such as avionics and space applications, the VLSI and MMIC components must be packaged within hermetically sealed packages. The configuration of prior art packages are generally incompatible with VLSI and MMIC technology due to the increased conductive pathway densities required. Increasing the number of conductive leads in prior art packages requires a concomitant increase in the number of apertures formed in the frame of the metal package, which generally requires an increase in overall package size and weight. The number of holes which may be formed in the body, however, is generally constrained by size, weight and structural considerations as discussed hereinabove.

One solution to the above-described problem is to utilize smaller diameter conductive leads which would permit a limited increase in conductive pathway density. Smaller conductive leads, however, are more fragile and subject to catastrophic failure during fabrication, handling, installation and/or operation in dynamic environments that are typically encountered in aerospace operations. In addition, smaller conductive leads require smaller apertures, and smaller apertures are more difficult to produce with consistent results. Moreover, smaller leads and smaller apertures require smaller insulative preforms to form the glass-to-metal seals. These smaller elements are difficult to handle and fabricate, thereby increasing the overall cost of the finished package.

SUMMARY OF THE INVENTION

The present invention surmounts the inherent disadvantages of prior art flat packs by providing a multi-path feed-thru lead that efficiently and economically permits an increase in the conductive pathway density without a significant increase in the overall size of the lead member. The multi-path feed-thru lead of the present invention has particular utility in combination with microcircuit packages to increase the conductive pathway density thereof without any significant decrease in the structural integrity thereof and/or increase in the size and weight thereof.

The multi-path feed-thru lead of the present invention has a predetermined geometric configuration that includes an extended intermediate portion and first and second end portions. The first and second end portions are configured to function as bonding pads that facilitate wire bonding to integrated circuit chips housed in the package and to external circuitry, respectively.

The multi-path feed-thru lead comprises an insulative substrate formed in the predetermined configuration and having a plurality of discrete metalized conductive paths formed on the intermediate and first and second end portions. The insulative substrate may be formed from an insulative material such as alumina, $Al_2O_3$ and may be a mechanically rigid structure or mechanically flexible structure, i.e., fibers. The plurality of discrete metalized conductive pathways may be formed as layers or coatings overlying the surfaces of the insulative substrate or the metalized conductive pathways may be partially diffused into the corresponding surfaces of the insulative substrate.

In one preferred method of forming the multi-path feed-thru lead of the present invention, an insulative substrate having the predetermined geometric configuration is formed. The external surfaces of the insulative substrate are then metalized to form a metalized substrate. Selected areas of metalization are then removed from the metalized substrate by conventional means such as a stripping die to form the plurality of discrete metalized conductive pathways on the intermediate portion and the first and second end portions. Strips of exposed insulative substrate separate and define adjacent metalized conductive pathways.

Each multi-path feed-thru lead according to the present invention thus provides a plurality of independent metalized conductive pathways on a single substrate member, thereby providing increased conductive pathway density for any given application. One or more of the metalized pathways may be grounded, depending upon the particular application. Conductive pathways of a multi-path feed-thru lead may be electrically interconnected by means of conductive interconnect traces to increase transmission capabilities.

The number of apertures required to be formed in the frame of the flat pack can be minimized by utilizing multi-path feed-thru leads according to the present invention. Alternatively, a significant increase in conductive pathway density may be achieved for a given package size.

BRIEF DESCRIPTION OF THE DRAWINGS

A more complete understanding of the present invention and the attendant advantages and features thereof will be more readily appreciated as the same becomes better understood by reference to the following detailed description when considered in conjunction with the accompanying drawings wherein.

DETAILED DESCRIPTION OF PREFERRED EMBODIMENTS

Figure 1:
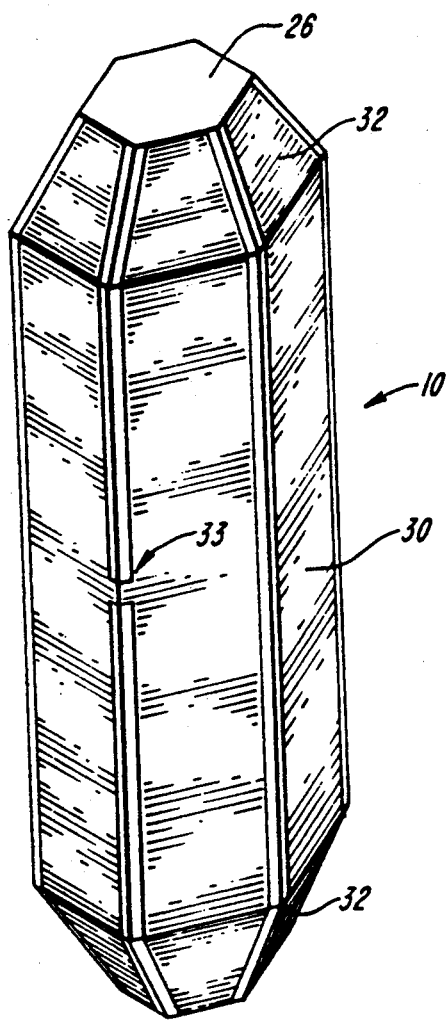
FIG. 1 is a perspective view of an exemplary embodiment of a multi-path feed-thru lead according to the present invention.

Referring now to the drawings wherein like reference numerals designates similar or corresponding elements throughout the several views, FIGS. 1 and 2A-2C illustrate an exemplary embodiment of a multi-path feed-thru lead 10 according to the present invention that has particular utility in combination with microcircuit packages housing hybrid and semiconductor discrete and integrated circuit chips. The multi-path feed-thru lead 10 includes an extended intermediate portion 22 and first and second end portions 24 integral with the intermediate portion 22. Extended as used herein defines a length of the intermediate portion 22 sufficient to pass through the package bottom or frame and to position the first and second end portions 24 for wire bonding to the circuitry housed in the package and external circuitry, respectively.

The multi-path feed-thru lead 10 of the present invention may be a mechanically rigid structure or a flexible structure, i.e., fiber, depending upon the particular application. As exemplarily illustrated in the drawings, the extended intermediate portion 22 is straight. It is to be understood, however, that the present invention is not to be limited by the exemplary drawings, but only by the scope of the claims. The first and second end portions 24 of the multi-path feed-thru lead 10 according to the present invention are configured to function as bonding pads that facilitate wire bonding to integrated circuit chips housed in the package and to external circuitry, respectively.

The exemplary multi-path feed-thru lead 10 illustrated in FIG. 1 has a hexagonal configuration such that the intermediate portion 22 thereof has six planar sides 23. The first and second end portions 24 are configured as hexagonal frustums, each end portion 24 having six corresponding tapered planar sides 25 terminating in an end face 26. For the embodiment of FIG. 1, the tapered planar sides 25 of the first and second end portions 24 define the bonding pads of the multi-path feed-thru lead 10.

It is to be understood that the Particular geometric shape of the illustrated multi-path feed-thru lead 10 is for purposes of explanation only. The multi-path feed-thru lead may be formed to have intermediate and end portions having a variety of geometric, configurations. The particular configuration will depend, inter alia, upon the number of conductive pathways, i.e., the conductive pathway density, required for the particular application, the size and shape of the frame of the package, and the outer dimensions of the multi-path feed-thru lead and the insulative preforms utilized therewith.

To form the exemplary multi-path feed-thru lead 10 according to the present invention, an insulative substrate 20 is formed to have a predetermined geometric configuration including an intermediate portion 22 and first and second end portions 24. The insulative substrate 20 may be formed from a number of insulative materials. The insulative material, when formed into the particular geometric configuration of the substrate, should have structural integrity, e.g., rigid, flexible, consonant with the particular application environment in which the package is intended to operate. The insulative material should also have a coefficient of thermal expansion that is compatible with the insulative preforms and metallic materials utilized in fabricating the package. Disclosure regarding coefficients of thermal expansion, and exemplary preforms having utility in the formation of glass-to-metal seals, is presented in U.S. Pat. Nos. 4,716,082 and 4,788,382, which are hereby incorporated by reference. Ceramics such as alumina, $Al_2O_3$, may be utilized as the insulative material to form the insulative substrate of the present invention.

Discrete pathways of conductive metal 30, 32 are formed on each of the corresponding sides 23, 25 of the extended intermediate portion 22 and the firs and second end portions 24, respectively, of the multi-sided insulative substrate 20. The portions of the metalized conductive pathways 32 formed on the sides 25 of the first and second end portions 24 function as metalized bonding pads that are integrally coupled with the metalized conductive pathways 30 formed on the extended intermediate portion 22. The metalized bonding pads 32 provide the means for wire bonding the integrated circuit chips (not shown) housed within the flat pack and the external circuitry (not shown), respectively.

Adjacent metalized, conductive pathways 30 may be electrically interconnected by means of one or more conductive interconnect traces 33. The conductive interconnect traces 33 are formed on the insulative substrate 20 in the manner as described in further detail hereinbelow.

The metalized conductive pathways 30, 32 and conductive interconnect traces 33 may be formed as layers or coatings overlying the surfaces of the sides 23, 25 of the insulative substrate 20. Alternatively, the metalized conductive pathways 30, 32 may be partially diffused into the corresponding surfaces of the insulative substrate 20. The discrete metalized conductive pathways 30, 32 and conductive interconnect traces 33 may be formed on the insulative substrate 20 by one of the several known metalization techniques. One preferred method of forming the discrete metalized conductive pathways is described hereinbelow, but it will be appreciated that other known techniques may have applicability in forming the metalized conductive pathways.

Figure 2B:
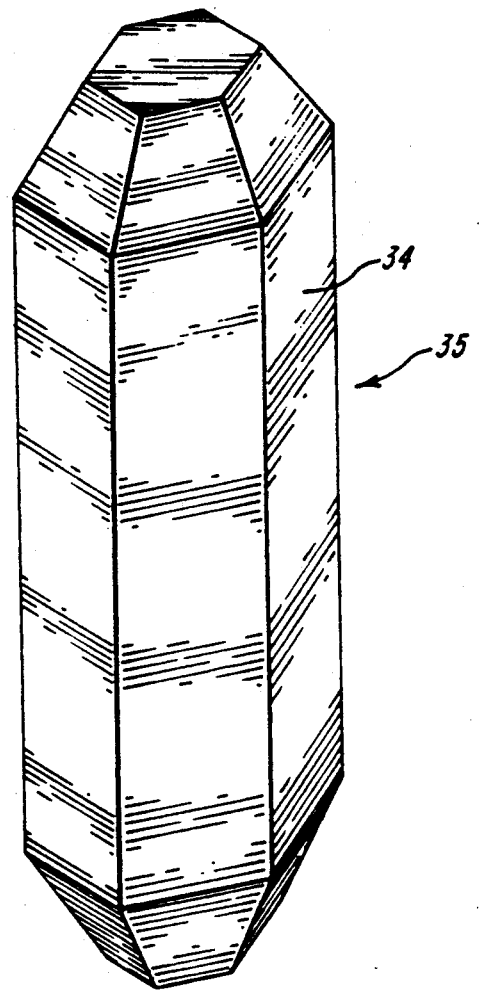
FIG. 2B is a perspective view of the insulative substrate of FIG. 2A having a metalized layer formed thereon and prior to formation of the plurality of metalized conductive pathways.

After the insulative substrate 20 having a predetermined geometrical configuration has been formed, the entire surface thereof is metalized with a conductive metal 34 as shown in FIG. 2B to form a metalized substrate 35. As noted hereinabove, the metalized layer 34 may be formed as a coating or layer superposed on the external surfaces of the insulated substrate 20. Alternatively, a portion of the metalized layer 34 may be diffused into the surfaces of the insulative substrate 20.

The metalized substrate 35 is then further processed, for example by means of a stripping die (not shown), to selectively remove portions of the metalized layer 34 from the metalized insulative substrate 35. A partially stripped metalized insulative substrate 35 is illustrated in FIG. 2C.

Figure 2C:
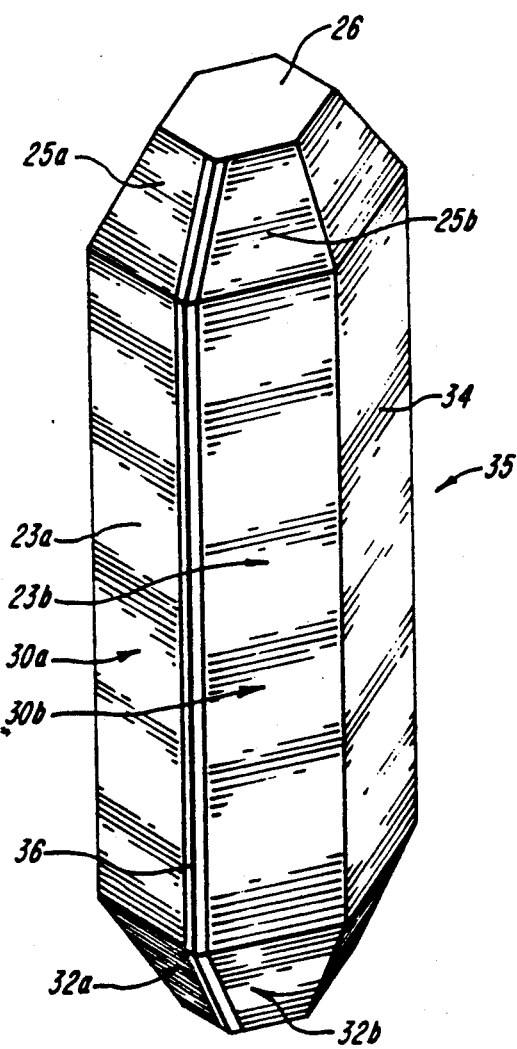
FIG. 2C is a perspective view of the metalized substrate of FIG. 2B with selected areas of metalization removed.

As illustrated in FIG. 2C, a single strip 36 of metalized layer has been selectively removed from the metalized substrate 35 along the edge between adjacent sides 23a, 23b of the extended intermediate portion 22 and the sides 25a, 25b of the first and second end portions 24. The strip 36 exposes the underlying insulative substrate to provide electrical isolation between the adjacent, partially formed discrete metalized conductive pathways 30a, 30b, 32a, 32b. Further selective removal of metalized layers along the edges between adjacent sides of the metalized substrate 35 results in the formation of a plurality (six for the hexagonal configuration illustrated) of discrete conductive pathways 30, 32. For the the multi-path feed-thru lead 10 illustrated in FIG. 1, the discrete conductive pathways 30, 32 are formed on respective sides 23, 25, and centered with respect thereto. The metalized layer 34 is also selectively removed from the end faces 26 of the first and second end portions 24, as exemplarily illustrated in FIG. 2C.

Referring to FIG. 1, the multi-path feed-thru lead 10 has six discrete metalized conductive pathways 30, 32, each metalized conductive pathway 30, 32 being defined by respective exposed strips 36 of insulative substrate. As exemplarily illustrated, one pair of adjacent metalized conductive pathways 30 are electrically interconnected by means of a conductive interconnecting trace 33. Thus, the multi-path feed-thru lead of the present invention comprises a single substrate member that provides a plurality of conductive pathways, some of which may be electrically interconnected. It will be appreciated that the multi-path feed-thru lead of the present invention may provide more or less conductive pathways depending upon the configuration of the underlying insulative substrate and the manner of selectively removing metalized portions from the metalized insulative substrate.

Figure 3A:
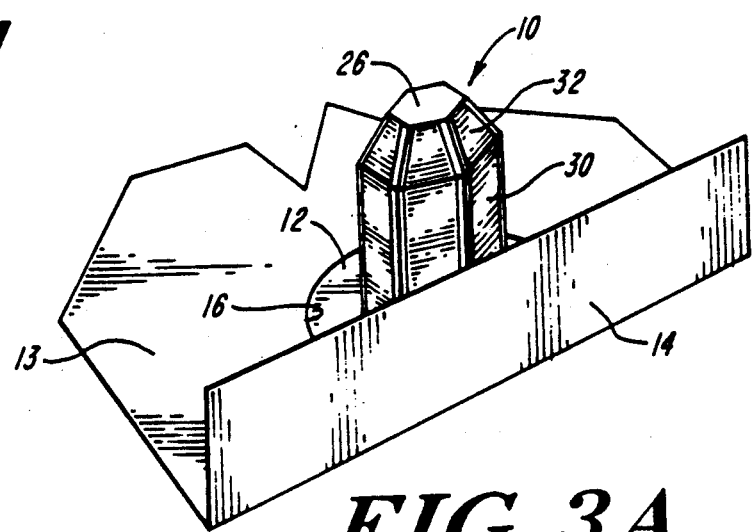
FIG. 3A is a partial perspective view of the multi-path feed-thru lead of FIG. 1 as utilized in combination with a plug-in package.
Figure 3B:
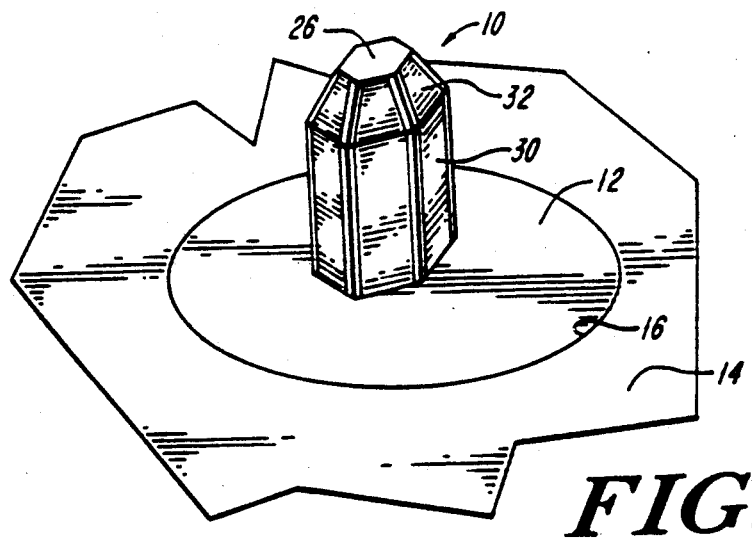
FIG. 3B is a partial perspective view of the multi-path feed-thru lead of FIG. 1 as utilized in combination with a flat pack.
Figure 2A:
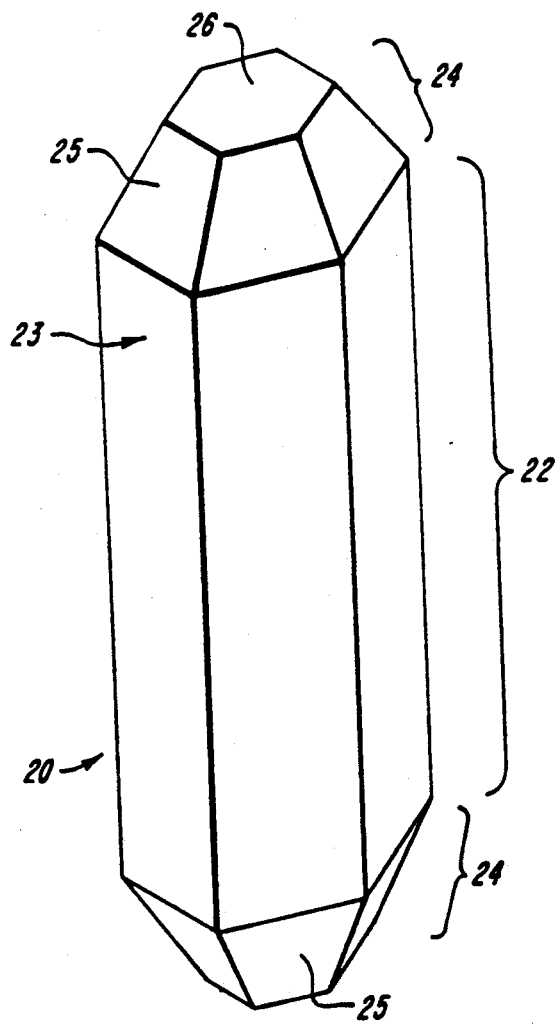
FIG. 2A is a perspective view of the multi-sided insulative substrate of the embodiment of FIG. 1.

The multi-path feed-thru lead 10 of the present invention has particular utility in combination with microcircuit packages housing hybrid and semiconductor discrete and integrated circuit chips. The use of a multi-path feed-thru lead 10 according to the present invention in combination with a hermetically sealed package is exemplarily illustrated in FIGS. 3A, 3B. The multi-path feed-thru lead 10 may be disposed within an aperture 16 formed in the bottom member 13 of a plug-in package (FIG. 3A) or in the aperture 16 of the frame or body 14 of a flat pack (FIG. 3B) by means of a insulative preform 12 such as the type disclosed in U.S. Pat. Nos. 4,716,082 and 4,788,382. A glass-to-metal seal is formed between the insulative preform 12 and the metal package 14 at the aperture 16 to provide a hermetically sealed package.

In prior art packages, each aperture formed in the bottom or frame has sealed therein a single conductive lead that provided a single conductive pathway between the integrated circuitry housed within the package and external circuitry. Each multi-path feed-thru lead of the present invention, in contrast, provides a plurality of conductive pathways for each aperture. Thus, the multi-path feed-thru lead of the present invention in combination with a given package configuration provides a manifold increase in conductive pathway density. The performance characteristics of the multi-path feed-thru lead according to the present invention may be readily modified by material selection, geometric configuration, and/or metalization pattern for different applications.

The multi-path feed-thru lead according to the present invention has been described hereinabove in terms of its utility in combination with packages. It is to be understood that the multi-path feed-thru lead according to the present invention may have other applications, and therefore, the present disclosure is not intended to limit the scope of the multi-path feed-thru lead to use in combination with microcircuit packages.

Numerous modifications and variation of the present invention are possible in light of the above teachings. It is therefore to be understood that within the scope of the appended claims, the present invention may be practiced otherwise than as specifically described hereinabove.

What is claimed is:

1. A multi-path feed-thru lead providing increased conductive pathway density, comprising:
   an insulative substrate having a predetermined configuration, said insulative substrate including an extended intermediate portion and first and second end portions, said first and second end portions having configurations defining a first and second plurality of bonding pads, respectively;
   a plurality of metalized conductive pathways formed on said intermediate portion and said plurality of bonding pads defined by said first and second end portions, respectively, of said insulative substrate;
   adjacent ones of said metalized conductive pathways being defined and separated by exposed strips of said insulative substrate; and
   conductive interconnect trace means formed in said exposed strips of said insulative substrate for electrically interconnecting at least one adjacent pair of said metalized conductive pathways.

2. A method of forming the multi-path feed-thru lead of claim 1 wherein:
   said plurality of metalized conductive pathways and said conductive interconnect trace means are formed by selectively metalizing said extended intermediate portion and said first and second plurality of bonding pads of said first and second end portions, respectively, of said insulative substrate.

3. A method of forming the multi-path feed-thru lead of claim 1 wherein said plurality of metalized conductive pathways and said conductive interconnect trace means are selectively formed by:
   metalizing the exterior surface of said insulative substrate; and
   selectively removing portions of said metalized exterior surface from said extended intermediate portion and said first and second plurality of bonding pads of said first and second end portions, respectively, of said insulative substrate to form said exposed strips defining and separating said plurality of metalized conductive pathways and to form said conductive interconnect trace means for electrically interconnecting at least one adjacent pair of said metalized conductive pathways.

4. The multi-path feed-thru lead of claim 1, wherein: said insulative substrate has a predetermined coefficient of thermal expansion compatible with an insulative preform used in microelectronic circuit packaging for providing hermetic sealing therein.

5. The multi-path feed-thru lead of claim 4, wherein: said insulative substrate is fabricated from a ceramic material.

6. The multi-path feed-thru of claim 5, wherein said ceramic material is alumina.

7. A multi-path feed-thru lead providing increased conductive pathway density, comprising:
an insulative substrate having a predetermined configuration including an extended intermediate portion and first and second end portions, said first and second ned portions having configurations defining a first and second plurality of bonding pads, respectively;
said extended intermediate portion having a plurality of planar sides arranged to define a polygonal cross-sectional configuration for said extended intermediate portion;
each of said first and second end portions having a plurality of inwardly tapered planar sides terminating in an end face and arranged to define a polygonal frustum cross-sectional configuration, said inwardly tapered planar sides defining said defining said plurality of bonding pads;
each of said planar sides of said intermediate portion being contiguous with respective ones of said plurality of bonding pads of said first and second end portions; and
a plurality of metalized conductive pathways formed on said intermediate portion and said first and second end portions, respectively;
adjacent ones of said metalized pathways being defined and separated by exposed strips of said insulative substrate.

8. The multi-path feed-thru lead of claim 7 wherein said plurality of metalized conductive pathways are formed on said planar sides of said intermediate portion and said inwardly tapered planar sides of said first and second end portions defining said plurality of bonding pads, and further wherein each said exposed strip of insulative substrate defining and separating said metalized conductive pathways includes edge portions between adjacent said planar sides of said intermediate portion and edge portions between adjacent said tapered planar sides of said first and second end portions, respectively.

9. A method for forming a multi-path feed-thru lead, comprising:
forming an insulative substrate having a predetermined configuration including an extended intermediate portion and first and second end portions having configurations defining a first and second plurality of bonding pads, respectively;
forming a plurality of metalized conductive pathways on said intermediate portion and said first and second plurality of bonding pads of said first and second end portions, respectively, of said insulative substrate, adjacent ones of said metalized conductive pathways being defined and separated by respective exposed strips of said insulative substrate; and
forming at least one conductive metalized interconnecting trace between adjacent said metalized conductive pathways for electrical interconnection therebetween.

10. A method for forming a multi-path feed-thru lead, comprising:
forming an insulative substrate having a predetermined configuration including an extended intermediate portion and first and second end portions having configurations defining a first and second plurality of bonding pads, respectively;
selectively metalizing said extended intermediate portion and said first and second plurality of bonding pads of said first and second end portions, respectively, of said insulative substrate to form a plurality of metalized conductive pathways, adjacent ones of said metalized conductive pathways being defined and separated by respective exposed strips of said insulative substrate; and
selectively metalizing said extended intermediate portion of said insulative substrate to form at least one conductive metalized interconnecting trace between said adjacent metalized conductive pathways for electrical interconnection therebetween.

11. The method of claim 9 wherein said selective metalizing step further comprises the steps of:
metalizing said insulative substrate to form a metalized insulative substrate; and
selectively stripping metalization from said metalized insulative substrate to form said respectively exposed strips of said insulative substrate, said respective exposed strips of said insulative substrate defining and separating adjacent ones of said metalized conductive pathways of said insulative substrate.

12. A method for forming a multi-path feed-thru lead, comprising:
forming an insulative substrate having a predetermined configuration including an extended intermediate portion and first and second end portions having configurations defining a first and second plurality of bonding pads, respectively;
metalizing said insulative substrate to form a metalized insulative substrate; and
selectively stripping metalization from said metalized insulative substrate to form respective exposed strips of said insulative substrate defining and separating adjacent metalized conductive pathways of said metalized insulative substrate wherein said selective metalizing stripping step further includes:
selectively stripping metalization from said metalized insulative substrate to form at least one conductive interconnect trace between an adjacent pair of said metalized conductive pathways to provide electrical interconnection therebetween.

13. A multi-path feed-thru lead providing increased conductive pathway density, comprising:
an insulative substrate having a predetermined configuration including an extended intermediate portion and first and second end portions, said first and second end portions having configurations defining a first and second plurality of bonding pads, respectively;
said extended intermediate portion having a plurality of planar sides arranged to define a polygonal cross-sectional configuration for said extended intermediate portion;

each of said first and second portions including a plurality of inwardly tapered planar sides terminating in an end face, said inwardly tapered planar sides defining said plurality of bonding pads;

each of said planar sides of said intermediate portion being contiguous with respective ones of said plurality of bonding pads of said first and second end portions; and a plurality of metalized conductive pathways formed on said intermediate portion and said plurality of bonding pads defined by said first and second end portions, respectively, of said insulative substrate; adjacent ones of said metalized conductive pathways being defined and separated by exposed strips of said insulative substrate.

14. A method for forming a multi-path feed-thru lead, comprising:

forming an insulative substrate having a predetermined configuration including an extended intermediate portion and first and second end portions having configurations defining a first and second plurality of bonding pads, respectively;

said extended intermediate portion having a plurality of planar sides arranged to define a polygonal cross-sectional configuration for said extended intermediate portion;

each of said first and second end portions including a plurality of inwardly tapered planar sides terminating in an end face, said inwardly tapered planar sides defining said plurality of bonding pads;

each of said planar sides of said intermediate portion being contiguous with respective ones of said plurality of bonding pads of said first and second end portions; and forming a plurality of metalized conductive pathways on said intermediate portion and said first and second plurality of bonding pads of said first and second end portions, respectively, of said insulative substrate, adjacent ones of said metalized conductive pathways being defined and separated by respective exposed strips of said insulative substrate.

15. The method of claim 14, further comprising:

forming at least one conductive metalized interconnecting trace between adjacent said metalized conductive pathways for electrical interconnection therebetween.

16. The method of claim 14, wherein:

said inwardly tapered planar sides defining said bonding pads are arranged to define a polygonal frustum cross-sectional configuration.

17. The method of claim 16, further comprising:

forming at least one conductive metalized interconnecting trace between adjacent said metalized conductive pathways for electrical interconnection therebetween.

* * * * *